United States Patent
Case (10) Patent No.: US 7,555,831 B2
(45) Date of Patent: Jul. 7, 2009

(54) METHOD OF VALIDATING COMPONENT FEEDER EXCHANGES

(75) Inventor: Steven K. Case, St. Louis Park, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 11/131,925

(22) Filed: May 18, 2005

(65) Prior Publication Data

US 2005/0268460 A1    Dec. 8, 2005

Related U.S. Application Data

(60) Provisional application No. 60/572,280, filed on May 18, 2004.

(51) Int. Cl.
    *B23P 19/00*    (2006.01)
(52) U.S. Cl. .............................. 29/740; 29/702; 29/720; 29/833; 700/221
(58) Field of Classification Search .................... 29/701, 29/702, 720, 739, 740, 832, 833, 407.04, 29/834; 206/459.5, 714, 715; 235/375, 376; 700/56–59, 95, 96, 213, 221, 229
See application file for complete search history.

(56) References Cited

U.S. PATENT DOCUMENTS

| | | | |
|---|---|---|---|
| 3,814,845 A | 6/1974 | Hurlbrink, III et al. ........ | 178/6.8 |
| 4,281,342 A | 7/1981 | Ueda et al. ..................... | 348/94 |
| 4,809,430 A | 3/1989 | Maryuama et al. ............ | 29/834 |
| 4,825,091 A | 4/1989 | Breyer et al. ........... | 250/559.38 |
| 4,914,513 A | 4/1990 | Spigarelli et al. ........... | 358/101 |
| 4,978,224 A | 12/1990 | Kishimoto et al. .......... | 356/394 |
| 4,989,082 A | 1/1991 | Hopkins ..................... | 358/101 |
| 4,999,785 A | 3/1991 | Schmuter .................... | 364/507 |
| 5,003,692 A | 4/1991 | Izumi et al. .................... | 29/834 |
| 5,023,916 A | 6/1991 | Breu .............................. | 382/8 |
| 5,060,366 A | 10/1991 | Asai et al. ..................... | 29/739 |
| 5,105,149 A | 4/1992 | Tokura ........................ | 324/158 |
| 5,129,725 A | 7/1992 | Ishizuka et al. ............. | 356/617 |

(Continued)

FOREIGN PATENT DOCUMENTS

EP    0 664 666 B1    8/1997

(Continued)

OTHER PUBLICATIONS

International Search Report and Written Opinion from application No. PCT/US05/017425, filed May 18, 2005.

(Continued)

*Primary Examiner*—Donghai D. Nguyen
(74) *Attorney, Agent, or Firm*—Christopher R. Christenson; Westman, Champlin & Kelly, P.A.

(57) ABSTRACT

A method and apparatus for facilitating validation of component feeder exchanges in pick and place machines are provided. A pre-exchange image of a component from a feeder is acquired and compared with an image a component from the exchanged feeder placed after the feeder exchange. A comparison of the pre-exchange image with the post-exchange image facilitates simple and quick feeder exchange validation. Aspects of the present invention are practicable with different types of pick and place machines, and are able to advantageously use sensors and/or technician supplied information to generate automatic indications of feeder exchange validity.

7 Claims, 5 Drawing Sheets

U.S. PATENT DOCUMENTS

| | | | |
|---|---|---|---|
| 5,134,665 A | 7/1992 | Jyoko | 382/8 |
| 5,194,791 A | 3/1993 | Cull | 318/568.1 |
| 5,235,316 A | 8/1993 | Qualizza | 340/436 |
| 5,237,622 A | 8/1993 | Howell | 382/8 |
| 5,249,349 A | 10/1993 | Kuinose et al. | 29/721 |
| 5,298,977 A | 3/1994 | Shintani et al. | 356/376 |
| 5,336,935 A * | 8/1994 | Shitanda et al. | 29/720 |
| 5,377,405 A | 1/1995 | Sakurai et al. | 29/833 |
| 5,383,270 A | 1/1995 | Iwatsuka et al. | 29/840 |
| 5,384,956 A | 1/1995 | Sakurai et al. | 29/834 |
| 5,392,360 A | 2/1995 | Weindelmayer et al. | 382/8 |
| 5,450,204 A | 9/1995 | Shigeyama et al. | 356/378 |
| 5,461,480 A | 10/1995 | Yamada et al. | 256/394 |
| 5,467,186 A | 11/1995 | Indo et al. | 356/150 |
| 5,471,310 A | 11/1995 | Spigarelli et al. | 356/399 |
| 5,495,424 A | 2/1996 | Tokura | 364/507 |
| 5,541,834 A | 7/1996 | Tomigashi et al. | 364/167.01 |
| 5,550,583 A | 8/1996 | Amir et al. | 348/126 |
| 5,566,447 A | 10/1996 | Sakurai | 294/832 |
| 5,589,942 A | 12/1996 | Gordon | 356/611 |
| 5,598,345 A | 1/1997 | Takura | 364/489 |
| 5,619,328 A | 4/1997 | Sakurai | 356/375 |
| 5,627,913 A | 5/1997 | Spigarelli et al. | 382/151 |
| 5,660,519 A | 8/1997 | Ohta et al. | 414/783 |
| 5,686,994 A | 11/1997 | Tokura | 356/394 |
| 5,719,952 A | 2/1998 | Rooks | 382/150 |
| 5,724,722 A | 3/1998 | Hashimoto | 29/740 |
| 5,739,846 A | 4/1998 | Gieskes | 348/87 |
| 5,745,241 A | 4/1998 | Hashimoto | 356/384 |
| 5,749,142 A | 5/1998 | Hanamura | 29/833 |
| 5,754,677 A | 5/1998 | Kawada | 382/141 |
| 5,835,133 A | 11/1998 | Moreton et al. | 348/49 |
| 5,839,186 A | 11/1998 | Onodera | 29/720 |
| 5,878,151 A | 3/1999 | Tang et al. | 382/103 |
| 5,900,940 A | 5/1999 | Aoshima | 356/375 |
| 5,903,353 A | 5/1999 | Raymond | 356/620 |
| 5,908,282 A | 6/1999 | Onodea | 414/783 |
| 5,912,984 A | 6/1999 | Michael et al. | 382/149 |
| 5,949,681 A | 9/1999 | Asai et al. | 700/113 |
| 5,956,149 A | 9/1999 | Suzuki et al. | 356/375 |
| 5,969,820 A | 10/1999 | Yoshi et al. | 356/375 |
| 5,982,927 A | 11/1999 | Koljonen | 382/168 |
| 6,027,019 A | 2/2000 | Kou | 235/375 |
| 6,047,084 A | 4/2000 | Kent et al. | 382/147 |
| 6,198,529 B1 | 3/2001 | Clark et al. | 356/237.5 |
| 6,223,425 B1 | 5/2001 | Asai et al. | 29/740 |
| 6,286,202 B1 | 9/2001 | Asai et al. | 39/740 |
| 6,317,972 B1 | 11/2001 | Asai et al. | 29/833 |
| 6,332,536 B2 * | 12/2001 | Easton | 206/713 |
| 6,334,840 B1 | 1/2002 | Asai et al. | 483/1 |
| 6,408,090 B1 | 6/2002 | Salomon et al. | 382/145 |
| 6,506,614 B1 | 1/2003 | Strassmann | 438/7 |
| 6,538,244 B1 | 3/2003 | Skunes | 250/208.1 |
| 6,549,647 B1 | 4/2003 | Skunes et al. | 382/150 |
| 6,616,263 B2 | 9/2003 | Allen et al. | 347/19 |
| 6,622,054 B1 | 9/2003 | Okuda et al. | 700/51 |
| 6,681,151 B1 | 1/2004 | Weinzimmer et al. | 700/259 |
| 6,738,505 B1 | 5/2004 | Prince | 382/150 |
| 6,748,649 B2 | 6/2004 | Okuda et al. | 29/740 |
| 6,762,847 B2 | 7/2004 | Durquette et al. | 356/614 |
| 6,778,878 B1 | 8/2004 | Kou | 700/221 |
| 6,801,652 B1 * | 10/2004 | Stanzl et al. | 382/147 |
| 6,807,725 B2 | 10/2004 | Asai et al. | 29/740 |
| 6,891,967 B2 | 5/2005 | Prince | 382/150 |
| 6,966,235 B1 | 11/2005 | Paton | 73/865.9 |
| 7,083,082 B2 * | 8/2006 | Byskov et al. | 235/375 |
| 2001/0040117 A1 | 11/2001 | Easton | 206/714 |
| 2002/0014003 A1 | 2/2002 | Asai et al. | 29/740 |
| 2002/0031279 A1 | 3/2002 | Shimizu | 382/291 |
| 2002/0053133 A1 | 5/2002 | Suhara et al. | 29/700 |
| 2002/0069395 A1 | 6/2002 | Fujiwara et al. | 716/34 |
| 2002/0078580 A1 | 6/2002 | Haugen et al. | 33/533 |
| 2002/0099466 A1 | 7/2002 | Diggin et al. | 700/121 |
| 2002/0112064 A1 | 8/2002 | Eastvold | 709/230 |
| 2002/0124391 A1 | 9/2002 | Kawai et al. | 29/739 |
| 2002/0133940 A1 | 9/2002 | Kadomatsu et al. | 29/832 |
| 2002/0143423 A1 | 10/2002 | Huber et al. | 700/121 |
| 2003/0027363 A1 | 2/2003 | Kodama | 438/14 |
| 2003/0029033 A1 | 2/2003 | Hidese et al. | 29/833 |
| 2003/0098426 A1 | 5/2003 | Hayata | 250/559.34 |
| 2003/0110610 A1 | 6/2003 | Duquette et al. | 29/407.09 |
| 2003/0159515 A1 | 8/2003 | Tonomura | 73/584 |
| 2003/0219330 A1 | 11/2003 | Lyndaker et al. | 414/411 |
| 2003/0225547 A1 | 12/2003 | Paradies | 702/150 |
| 2004/0094594 A1 | 5/2004 | Liebeke | 226/32 |
| 2004/0119987 A1 | 6/2004 | Madsen et al. | 356/614 |
| 2004/0163243 A1 | 8/2004 | Noda et al. | 29/834 |
| 2004/0186616 A1 | 9/2004 | Overman et al. | 700/224 |
| 2005/0115060 A1 | 6/2005 | Kondo | 29/650 |
| 2005/0117797 A1 | 6/2005 | Gaida | 382/153 |
| 2005/0123187 A1 | 6/2005 | Bushman et al. | 382/141 |
| 2005/0125993 A1 | 6/2005 | Madsen et al. | 29/739 |
| 2005/0161498 A1 | 7/2005 | Byskov et al. | 235/376 |
| 2005/0210832 A1 | 9/2005 | Tassin et al. | 53/396 |
| 2005/0276464 A1 | 12/2005 | Duquette et al. | 382/151 |
| 2006/0016066 A1 | 1/2006 | Gaida et al. | 29/740 |
| 2006/0075631 A1 | 4/2006 | Case et al. | 29/709 |
| 2006/0174480 A1 | 8/2006 | Kawada | 29/833 |

FOREIGN PATENT DOCUMENTS

| | | |
|---|---|---|
| EP | 0 948 250 | 10/1999 |
| EP | 0 959 654 | 11/1999 |
| EP | 1 152 604 | 11/2001 |
| EP | 1 343 363 | 9/2003 |
| GB | 2 317 496 | 3/1998 |
| JP | 62298750 | 12/1987 |
| JP | 63090707 | 4/1988 |
| JP | 01309190 | 12/1989 |
| JP | 02076080 | 3/1990 |
| JP | 02235399 | 9/1990 |
| JP | 5-37918 | 2/1993 |
| JP | 6-249629 | 9/1994 |
| JP | 6-249630 | 9/1994 |
| JP | 6-310899 | 11/1994 |
| JP | 07183697 | 7/1995 |
| JP | 7-77319 | 8/1995 |
| JP | 7-336099 | 12/1995 |
| JP | 8032291 | 2/1996 |
| JP | 8-111598 | 4/1996 |
| JP | 9-021609 | 1/1997 |
| JP | 9-023097 | 1/1997 |
| JP | 9-205299 | 8/1997 |
| JP | 9-210626 | 8/1997 |
| JP | 9-214198 | 8/1997 |
| JP | 9-223898 | 8/1997 |
| JP | 9-246799 | 9/1997 |
| JP | 10136962 | 5/1998 |
| JP | 9-293998 | 9/1999 |
| JP | 11285925 | 10/1999 |
| JP | 2000-022392 * | 1/2000 |
| JP | 2000349499 A | 12/2000 |
| JP | 2001-165860 | 6/2001 |
| JP | 2001-168600 | 6/2001 |
| JP | 2001168594 | 6/2001 |
| JP | 2002271099 | 9/2002 |
| JP | 2003-092495 | 3/2003 |
| JP | 2003152392 | 5/2003 |
| JP | 2003-243898 | 8/2003 |
| JP | 2003243899 | 8/2003 |
| JP | 2003-304095 | 10/2003 |
| JP | 2005285840 | 10/2005 |
| WO | 0 932 331 A1 | 7/1999 |
| WO | WO 00/19794 | 4/2000 |

| WO | WO 00/19800 | 4/2000 |
| WO | WO 00/26640 | 5/2000 |
| WO | WO 01/67831 A2 | 9/2001 |
| WO | WO 02/29357 | 4/2002 |
| WO | WO 03/043400 A1 | 5/2003 |

OTHER PUBLICATIONS

The Notification of Transmittal of the International Preliminary Report from application No. PCT/US05/017425, filed May 18, 2005.
Chinese Office Action from Application No. 02826679.X, filed Nov. 12, 2002.
The International Preliminary Report on Patentability for foreign application No. PCT/US2004/036238 filed Oct. 29, 2004; Notification of Transmittal of The International Search Report and Written Opinion of the International Searching Authority for application No. PCT/US2004/036238, filed Oct. 29, 2004.
International Search Report from Appln No. PCT/US2004/036683, filed Nov. 3, 2004; International Preliminary Report on Patentability from Application No. PCT/US2004/036683, filed Nov. 3, 2004.
The Notification of Transmittal of International Preliminary Examination Report in foreign application No. 2005/025905, filed Jul. 21, 2005; International Search Report and Written Opinion from foreign application No. 2005/025905, filed Jul. 21, 2005.
The International Search Report from Appln No. PCT/US/2002/36154, filed Nov. 11, 2002.
The International Preliminary Report on Patentability in foreign Appln No. PCT/US/2004/036704, filed Nov. 3, 2004; Notification of Transmittal of the International Search Report and Written Opinion of the International Searching Authority in foreign Appln No. PCT/US/2004/036704, filed Nov. 3, 2004.
The International Preliminary Report on Patentability from Appln No. PCT/US/2005/35985, filed Oct. 5, 2005; International Search Report and Written Opinion from Appln No. PCT/US/2005/35985, filed Oct. 5, 2005.
The International Search Report and Written Opinion from Appln No. PCT/US/2006/019281, filed May 18, 2006.

\* cited by examiner

METHOD OF VALIDATING COMPONENT FEEDER EXCHANGES

CROSS REFERENCE TO RELATED APPLICATIONS

This application claims priority to U.S. provisional patent application Ser. No. 60/572,280, filed May 18, 2004 entitled COMPONENT FEEDER EXCHANGE DIAGNOSTIC TOOL. This application is related to U.S. patent application Ser. No. 10/291,074, filed Nov. 8, 2002, entitled Pick and Place Machine with Component Placement Inspection, which application claims priority to the following prior provisional applications: Ser. No. 60/338,233 filed Nov. 13, 2001 entitled INSPECTION METHODS FOR A PICK AND PLACE MACHINE; Ser. No. 60/356,801 filed Feb. 13, 2002 entitled PICK AND PLACE MACHINE WITH COMPONENT PLACEMENT INSPECTION; and Ser. No. 60/374,964 filed Apr. 22, 2002 entitled IMPROVED INSPECTION.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Pick and place machines are generally used to manufacture electronic circuit boards. A blank printed circuit board is usually supplied to the pick and place machine, which then picks electronic components from component feeders, and places such components upon the board. The components are held upon the board temporarily by solder paste, or adhesive until a subsequent step in which the solder paste is melted, or the adhesive is fully cured.

Pick and place machine operation is challenging. Since machine speed corresponds with throughput, the faster the pick and place machine runs, the less costly the manufactured board. Additionally, placement accuracy is extremely important. Many electrical components, such as chip capacitors and chip resistors are relatively small and must be accurately placed on equally small placement locations. Other components, while larger, have a significant number of leads or conductors that are spaced from one another at a relatively fine pitch. Such components must also be accurately placed to ensure that each lead is placed upon the proper pad. Thus, not only must the machine operate extremely fast, but it must also place components extremely accurately.

In order to enhance the quality of board manufacture, fully or partially populated boards are generally inspected after the placement operation(s), both before and after solder reflow, in order to identify components that are improperly placed or missing or any of a variety of errors that may occur. Automatic systems that perform such operation(s) are highly useful in that they help identify component placement problems prior to solder reflow allowing substantially easier rework or identify defective boards after reflow that are candidates for rework. One example of such a system is sold under the trade designation Model KS Flex available from CyberOptics Corporation of Golden Valley, Minn. This system can be used to identify such problems as alignment and rotation errors; missing and flipped components; billboards; tombstones; component defects; incorrect polarity; and wrong components. Identification of errors pre-reflow provides a number of advantages. Rework is easier; closed-loop manufacturing control is facilitated; and less work in-process exists between error generation and remedy. While such systems provide highly useful inspection, they do consume plant floor-space as well as programming time maintenance efforts and the like.

One relatively recent attempt to provide the benefits of after-placement inspection located within a pick a place machine itself is disclosed in U.S. Pat. No. 6,317,972 to Asai et al. That reference reports a method for mounting electric components where an image of a mounting location is obtained prior to component placement, and compared with an image of the mounting location after component placement to inspect the placement operation at the component level.

While the state of the art for component placement machines has advanced, such machines still require a relatively significant amount of setup, and operator attention. Often, such operations require the placement machine to be taken offline, thus not producing any product for the duration of the setup or maintenance operation. Accordingly, reducing the duration of such operations can provide a significant improvement in effective throughput of a given machine. Pick-and-place machines require such operations as reprogramming, changes of conveyors, workpiece setup, and feeder exchanges. Advances in the design and assembly of printed circuit boards, in particular, have generated a shift toward high-mix, low-volume (HMLV) manufacturing, which requires a higher frequency of line changeovers.

When a given component feeder is depleted of all components, the feeder is generally exchanged with a new feeder having a new supply of the same components. However, it is possible that the new feeder may have incorrect component values; incorrect component type; and incorrect polarity. Thus, when such a feeder exchange is required, the new feeder and/or components placed therefrom must be carefully analyzed by a technician to assure that the placement process can resume. This technician time consumes labor costs, while simultaneously keeping the machine offline. Accordingly, it is important to minimize the time required to effect any given component feeder exchange.

SUMMARY OF THE INVENTION

A method and apparatus for facilitating validation of component feeder exchanges in pick and place machines are provided. A pre-exchange image of a component from a feeder is acquired and compared with an image a component from the exchanged feeder placed after the feeder exchange. A comparison of the pre-exchange image with the post-exchange image facilitates simple and quick feeder exchange validation. Aspects of the present invention are practicable with different types of pick and place machines, and are able to advantageously use sensors and/or technician supplied information to generate automatic indications of feeder exchange validity.

DETAILED DESCRIPTION OF THE ILLUSTRATIVE EMBODIMENTS

Figure 1A:
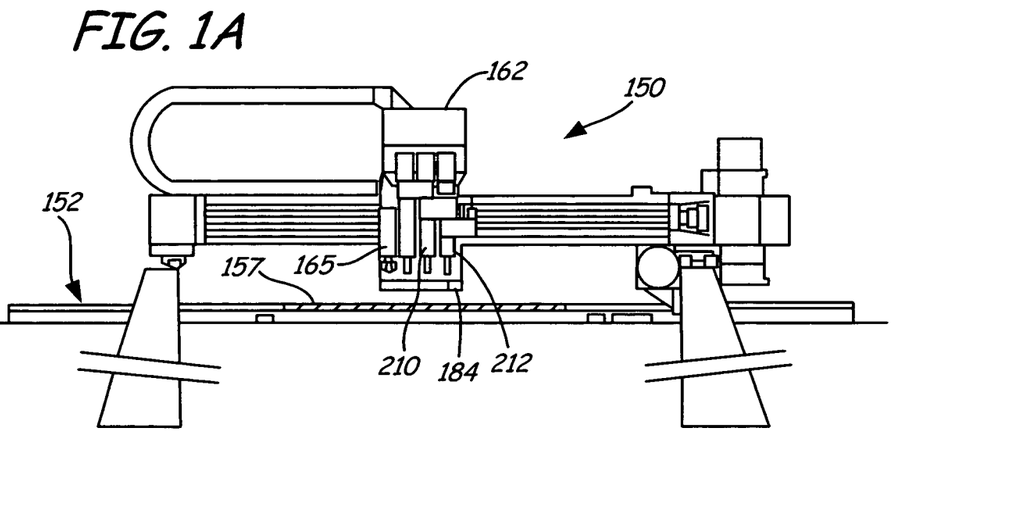
FIG. 1A is an elevation view of a pick and place machine with which embodiments of the invention can be practiced.
Figure 1B:
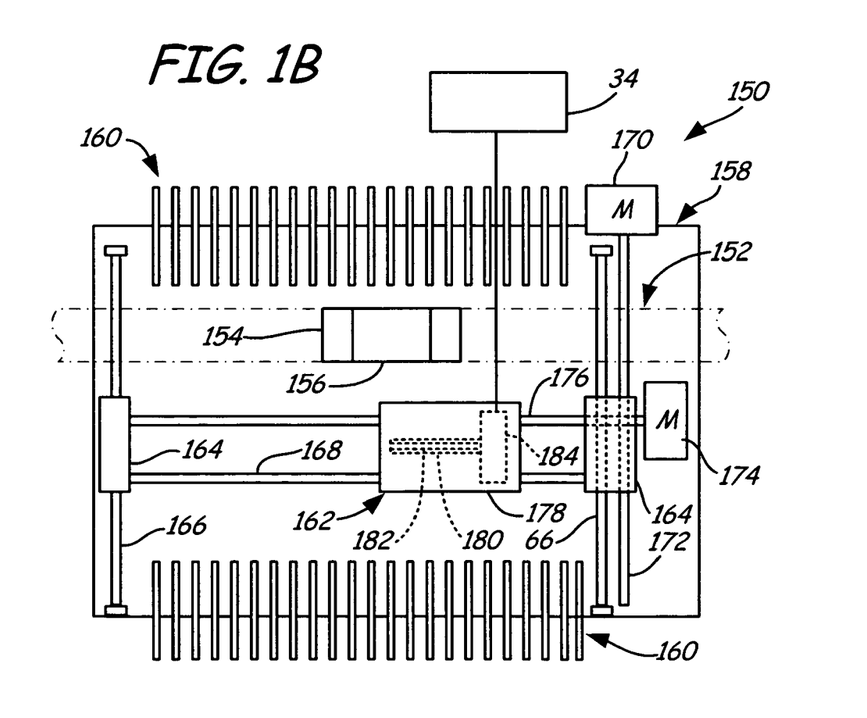
FIG. 1B is a top plan view of a pick and place machine with which embodiments of the invention can be practiced.

FIGS. 1A and 1B are elevation and top plan views, respectively, of a Cartesian-type pick and place machine 150 for which embodiments of the present invention are particularly useful. Although the description of FIGS. 1A and 1B will be provided with respect to pick and place machine 150, other forms of pick and place machines such as split gantry and/or turret-style designs can be used.

FIG. 1A is an elevation view of pick and place machine 150. Pick and place machine 150 receives a workpiece, such as circuit board 157, via transport system or conveyor 152. Placement head 162 then obtains one or more electrical components to be mounted upon workpiece 157 from component feeders (shown in FIG. 1B) and moves in x, y and z directions to place the component in the proper orientation at the proper location upon workpiece 157. Placement head 162 may include sensor 184 that may pass under components held by nozzles 210 and 212 as placement head 162 moves the component(s) from pickup locations to placement locations. Sensor 162 allows placement machine 150 to view undersides of components held by nozzles 210 and 212 such that component orientation and, to some degree, component inspection can be effected while the component is being moved from the component pick-up location to the placement location. Other pick and place machines may employ a placement head that moves over a stationary camera to image the component. A downwardly-looking fiducial camera 165 is also preferably mounted upon head 162 and is disposed to obtain one or more images of workpiece 157.

As illustrated in FIG. 1B, transport mechanism 152 includes mounting section 154 and conveyor 156. Transport mechanism 152 is disposed on base 158 such that the workpiece is carried to mounting section 154 by conveyor 156. Feeder mechanisms 160 are generally disposed on either side of transport mechanism 152 and supply electronic components thereto. Feeders 160 can be any suitable devices adapted to provide electronic components. Each of feeders 160 may provide a different specified component to be placed. The exchange of any of feeders 160 is an undesirable task, as described above, since it generally necessitates taking machine 150 offline. The manner in which embodiments of the present invention reduce the duration of this task will be apparent later in the specification.

Pick and place machine 150 includes head 162 disposed above base 158. Head 162 is moveable between either of feeder mechanisms 160 and mounting section 154. As can be seen, head supports 164 are moveable on rails 166 thereby allowing head 162 to move in the y direction over base 158. Movement of head 162 in the y direction occurs when motor 170, in response to a motor actuation signal, rotates ball screws 172 which engages one of head supports 164 to thereby displace the support 164 in the y direction. Head 162 is also supported upon rail 168 to allow head movement in the x direction relative to base 158. Movement of head 162 in the x direction occurs when motor 174, in response to a motor actuation signal, rotates ball screw 176, which engages head 162 and displaces head 162 in the x direction. Other pick-and-place designs, even those which do not operate exclusively in x and y movements, may be adapted for use with the present invention.

Head 162 generally includes body 178, nozzle mount 180, nozzles 182, and sensor 184. Nozzle mount 180 is disposed within body 178 and mounts each of nozzles 182 within body 178. As used herein, "nozzle" is intended to mean any apparatus capable of releasably holding a component. Each of nozzles 182 is movable in the z direction (up/down), x and y directions, and is rotatable about the z axis by any suitable actuation members, such as servo motors.

From the above description, it is evident, that modern pick and place machines often include one or more imaging systems (such as fiducial camera 165 and/or component sensor 184).

Figure 2:
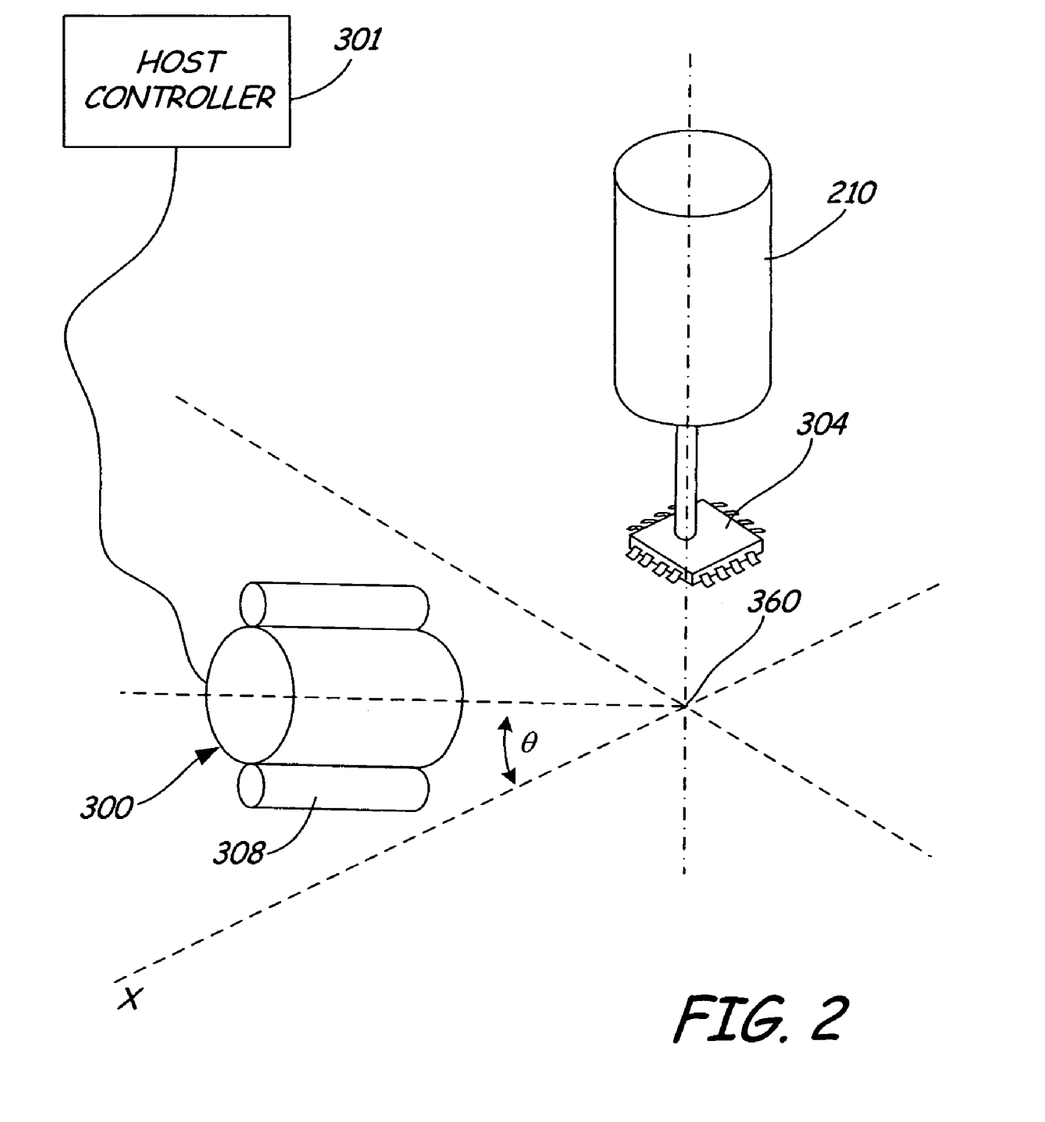
FIG. 2 is simplified diagrammatic view of an image acquisition system of a pick and place machine.

Recently, pick and place machines have achieved the ability to provide component placement inspection by viewing a given placement location immediately before and immediately after a component placement operation. FIG. 2 illustrates an exemplary image acquisition device 300 disposed to acquire images of placement location 360 of component 304 before component 304 is deposited by nozzle 210 upon location 360. Device 300 obtains an image of placement location 360 on workpiece 157 prior to placement of component 304, and then shortly thereafter. A comparison of these before and after images facilitates component-level placement inspection and verification. Since acquisition of images of the placement location is generally done when the nozzle, such as nozzle 210, holds the component 304 above the placement location, it is important to be able to image placement location 360 while minimizing or reducing interference from the component itself or adjacent components which may be already mounted upon the workpiece. Thus, it is preferred that device 300 employs an optical axis allowing a view that is inclined at an angle θ with respect to the plane of workpiece 157.

Embodiments of the present invention generally leverage image acquisition hardware currently present in pick and place machines to facilitate component feeder exchange. Specifically, an image of a component placed, or being placed prior to feeder exchange can be compared with a post-exchange image from the new feeder to expedite, or otherwise improve feeder exchange quality assurance.

Figure 3:
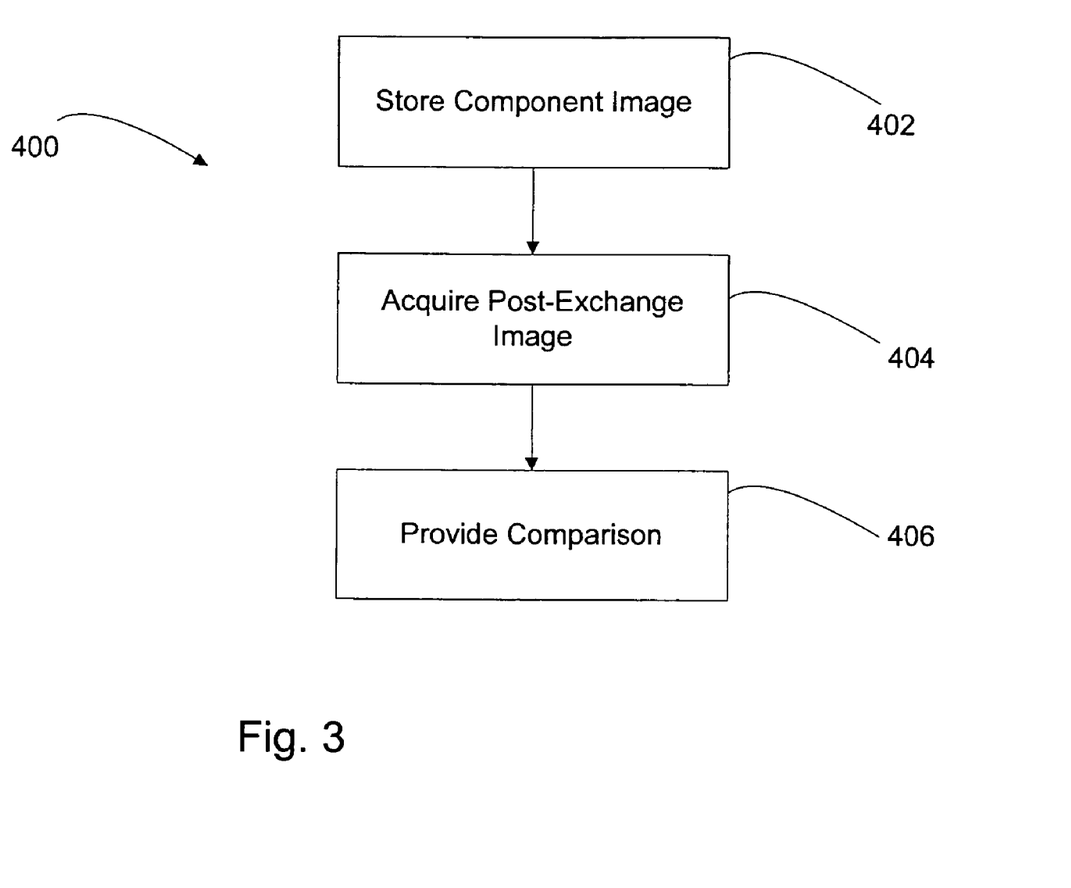
FIG. 3 is a flow diagram illustrating a method of operating a pick and place machine in accordance with an embodiment of the present invention.

FIG. 3 is a flow diagram illustrating a method of operating a pick and place machine in accordance with an embodiment of the present invention. Method 400 begins at block 402, where pick and place machine 150 acquires an image of a component. This image could be acquired by any suitable device including fiducial camera 165, sensor 184, and image acquisition system 300. Further, the image can be acquired while the component is being placed (such as from sensor 184) or after the component is placed upon workpiece 157 (for example, using camera 165 or system 300). In this embodiment, machine 150 preferably knows that the component being placed is the last component to be placed from a feeder that is to be exchanged. This information could be provided to machine 150 manually, such as by a technician indicating how many components the feeder contains when the feeder is loaded. Then, machine 150 simply counts how many of those components have been placed, and knows when it reaches the last one. Alternatively, a sensor signal could be generated by the feeder when it runs out of components, indicating that it is empty.

Figure 5:
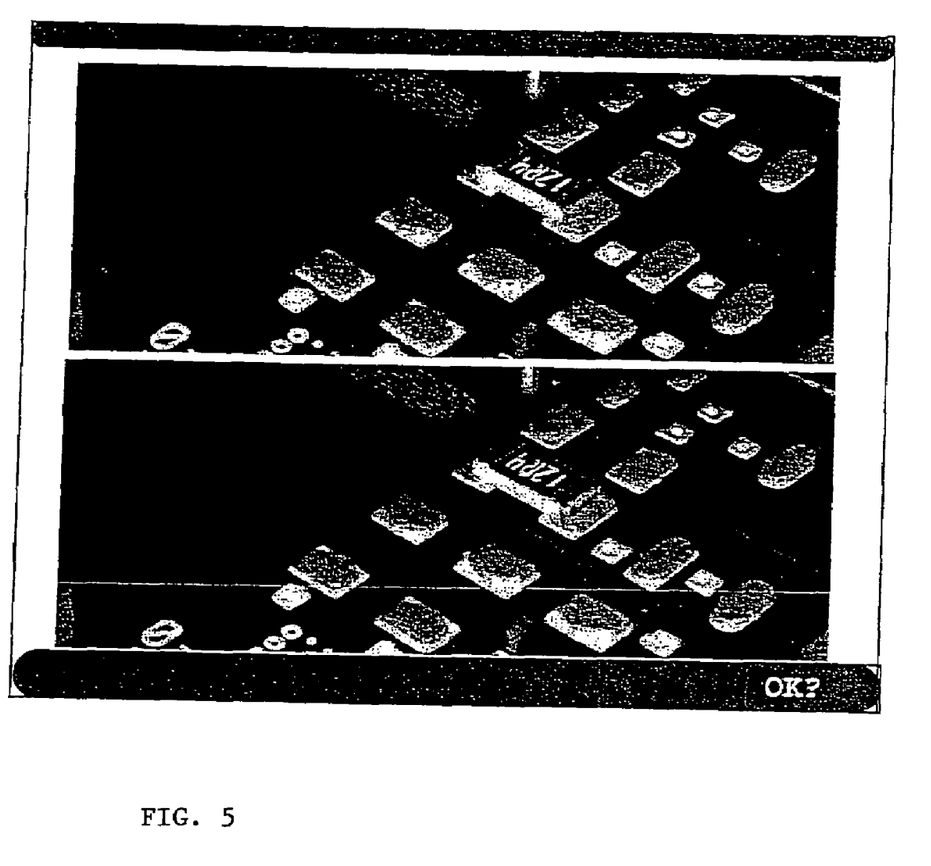
FIG. 5 is illustrates a comparison of two component placement images.

After the feeder exchange is performed, by a technician or automatically, block 404 is executed. At block 404, the pick and place machine acquires an image of a component from the newly exchanged feeder. This image may be of the component while it is being transported for placement (such as using sensor 184) or of the component once it is placed upon a workpiece (such as using camera 165 or system 300). At block 406, the images are compared. This comparison can be done by presenting the before and after exchange images to an operator and prompting the operator to accept or reject the feeder exchange. An example, of such an image is shown in FIG. 5. Alternatively, an automated comparison using known image analytics and vision tools may provide an automatic indication of exchange validity. For example, host controller 301 (shown in FIG. 2) can be configured to analyze the pre-exchange image and the post-exchange image to automatically generate an indication of exchange validity. Such techniques are able to ascertain differences in component size and shape. Additionally, some polarity indications (such as a polarity indicator on a chip capacitor) are viewable from the top of the component, and readily lend themselves to automated techniques. Further still, some techniques may include optical character recognition such that component specification indicia on the top of the components may be read, or otherwise imaged and compared.

Since acquisition of component images occurs during normal pick and place operations, some embodiments of the present invention may not even require any additional image acquisitions or synchronization over that already occurring.

Figure 4:
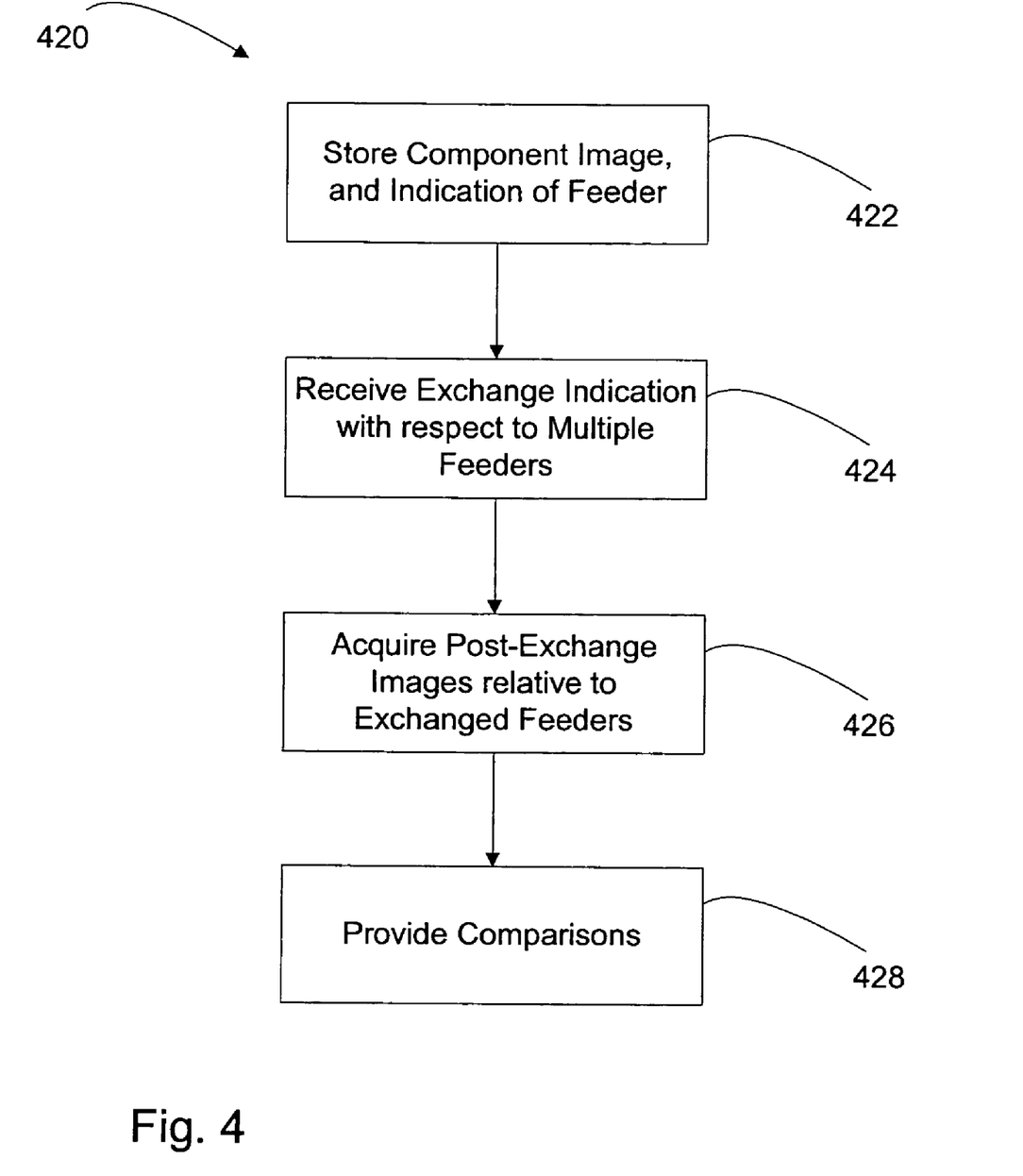
FIG. 4 is a flow diagram illustrating a method of operating a pick and place machine in accordance with another embodiment of the present invention.

FIG. 4 is a flow diagram illustrating a method of operating a pick and place machine in accordance with another embodiment of the present invention. Method 420 is similar to method 400, but is better suited for situations where the machine does not know, in advance, that a feeder exchange is to occur. Moreover, method 420 is also able to address multiple feeders being exchanged during technician intervention. Method 420 includes block 422 which generally store an image of a component, either placed or being placed, for each active feeder, along with an indication of the feeder to which the image is related. Accordingly, if ten feeders are active, block 422 of method 420 requires ten stored images, along with indications of the respective feeders. As a new component of a given feeder is placed, the stored image with respect to that feeder is overwritten with an image of the new component. Thus, there are essentially a number of image buffers that each store the most recent component image with respect their feeder.

At block 424, machine 150 receives an indication that one or more feeder exchanges is to occur, and accordingly moves into an offline state. This indication can be provided by a technician directly, such as entering data or providing some other form of input, indicating feeder exchange. However, this indication can also be done indirectly, such as by moving or displacing a component feeder, which movement could be registered by a switch physically coupled to the feeder and electrically coupled to machine 150. Moreover, an indication of which feeder(s) is/are exchanged could be provided in precisely the same manner. Once the exchange is complete, the technician indicates such to pick and place machine 150 (through any suitable input), and the exchange verification process begins. Since machine 150 knows which feeders were exchanged, and since machine 150 has a pre-exchange component image stored for all feeders, all that remains is to acquire a component image form each exchanged feeder. Accordingly, at block 426 machine 150 acquires an image of each component picked from a newly exchanged feeder.

At block 428, each image of a component from a newly exchanged feeder is compared with the associated pre-exchange image. This process is preferably simply an iterative of that described above with respect to block 406, but may also be accomplished by displaying all post-exchange figures and their associated pre-exchange figures. Moreover, this comparison can also be automated using suitable known image analysis techniques and algorithms.

FIG. 5 is illustrates a comparison of two component placement images. The upper half of FIG. 5 provides a pre-exchange component image of a component labeled "12R4", while the bottom portion provides a post-exchange image of another component. As can be seen, the upper portion is virtually identical to the lower portion, and thus a technician would be able to quickly and easily verify that the feeder exchange was acceptable by simply indicating "OK."

Although the present invention has been described with reference to preferred embodiments, workers skilled in the art will recognize that changes may be made in form and detail without departing from the spirit and scope of the invention.

What is claimed is:

1. A pick and place machine configured to facilitate validation of a feeder exchange, the machine comprising:

a placement head having at least one nozzle for releasably holding at least one component;

a robotic system for generating relative movement of the placement head between a feeder and a workpiece;

an image acquisition system disposed to acquire an image of a placement location of the component on the workpiece;

the feeder coupled to the machine and configured to provide a plurality of components;

wherein the image acquisition system is configured to acquire and store a pre-exchange image of at least one component previously selected from the feeder and placed on the workpiece prior to feeder exchange and after the component previously selected from the feeder is placed upon the workpiece, and to acquire a post-exchange image of at least one component previously selected from a new feeder and placed on the workpiece after feeder exchange and after the component previously selected from the new feeder is placed upon the workpiece; and wherein the image processing device is configured to process the pre-exchange image and post-exchange image to provide an indication of exchange validity.

2. The machine of claim 1, and further comprising a display device configured to display the pre-exchange image and the post-exchange image.

3. The machine of claim 1, wherein the image acquisition system is a fiducial camera.

4. The machine of claim 1, wherein the image acquisition system has an optical axis that is included with respect to the workpiece.

5. The machine of claim 1, wherein the machine is a Cartesian-type pick and place machine.

6. The machine of claim 1, wherein the machine is a split-gantry style machine.

7. The machine of claim 1, wherein the machine is a turret-style machine.

* * * * *